US012618154B2

(12) United States Patent
Tsai et al.

(10) Patent No.: US 12,618,154 B2
(45) Date of Patent: May 5, 2026

(54) SELECTIVE NON-PLASMA DEPOSITION OF MASK PROTECTION MATERIAL

(71) Applicant: Tokyo Electron Limited, Tokyo (JP)

(72) Inventors: Yu-Hao Tsai, Albany, NY (US); Du Zhang, Albany, NY (US); Peter Biolsi, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 341 days.

(21) Appl. No.: 18/533,537

(22) Filed: Dec. 8, 2023

(65) Prior Publication Data

US 2025/0188608 A1 Jun. 12, 2025

(51) Int. Cl.
| | |
|---|---|
| *C23C 16/04* | (2006.01) |
| *C23C 16/02* | (2006.01) |
| *C23C 16/34* | (2006.01) |
| *C23C 16/40* | (2006.01) |
| *C23C 16/455* | (2006.01) |
| *H01J 37/32* | (2006.01) |

(52) U.S. Cl.
CPC .... *C23C 16/45534* (2013.01); *C23C 16/0254* (2013.01); *C23C 16/04* (2013.01); *C23C 16/34* (2013.01); *C23C 16/342* (2013.01); *C23C 16/405* (2013.01); *H01J 37/32357* (2013.01); *H01J 2237/338* (2013.01)

(58) Field of Classification Search
CPC .......... C23C 16/45534; C23C 16/0254; C23C 16/34; C23C 16/40; C23C 16/042
See application file for complete search history.

(56) References Cited

U.S. PATENT DOCUMENTS

| | | | | |
|---|---|---|---|---|
| 3,461,003 A | * | 8/1969 | Jackson, Jr. ...... | H01L 21/76297 |
| | | | | 148/DIG. 115 |
| 9,673,058 B1 | | 6/2017 | Briggs et al. | |
| 11,043,379 B2 | | 6/2021 | Manna et al. | |
| (Continued) | | | | |

FOREIGN PATENT DOCUMENTS

KR 102571633 B1 8/2023

OTHER PUBLICATIONS

Alves, Marco AR, et al., "Selective deposition of amorphous hydrogenated carbon films used as masks for reactive ion etching of Si using CF4". Vacuum 52 (1999) 313-314.*

(Continued)

*Primary Examiner* — Bret P Chen
(74) *Attorney, Agent, or Firm* — Slater Matsil, LLP

(57) ABSTRACT

A method for selectively depositing a mask protection material using non-plasma treatments includes performing a non-plasma vapor treatment and performing a non-plasma halide treatment. During the non-plasma vapor treatment, a mask having openings exposing an underlying layer is treated with a non-plasma vapor to selectively deposit a first component of a mask protection material on the mask. During the non-plasma halide treatment, the mask and the underlying layer are treated with a non-plasma halide gas to selectively deposit a second component of the mask protection material on the mask. The non-plasma treatments are performed sequentially, but may be performed in either order. An optional pretreatment may be performed prior to the non-plasma treatments during which the mask is pretreated to form a reactive surface.

21 Claims, 11 Drawing Sheets

(56) References Cited

U.S. PATENT DOCUMENTS

| | | | | |
|---|---|---|---|---|
| 2006/0281281 A1* | 12/2006 | Tanzawa | .................. | H01L 22/12 |
| | | | | 438/459 |
| 2007/0194337 A1* | 8/2007 | Kondo | .................... | H01L 24/83 |
| | | | | 257/E33.059 |
| 2016/0163561 A1 | 6/2016 | Hudson et al. | | |
| 2016/0307766 A1 | 10/2016 | Jongbloed et al. | | |
| 2016/0314985 A1* | 10/2016 | Yang | .................. | H01J 37/32926 |
| 2018/0015493 A1* | 1/2018 | Kobayashi | ............. | H10K 50/11 |
| 2018/0175165 A1* | 6/2018 | Lim | ..................... | H10D 62/021 |
| 2018/0261448 A1 | 9/2018 | Smith et al. | | |
| 2020/0274068 A1* | 8/2020 | Shinno | ...................... | C25D 5/50 |
| 2021/0057213 A1 | 2/2021 | Ito et al. | | |
| 2021/0335624 A1 | 10/2021 | Dole et al. | | |
| 2021/0375615 A1* | 12/2021 | Krishtab | ............... | G03F 7/0042 |
| 2022/0197131 A1* | 6/2022 | Kuyel | ....................... | G03F 1/48 |

OTHER PUBLICATIONS

Matsui, Miyako, et al., "Selective mask deposition using SiCl4 plasma for highly selective etching process". J. Vac. Sci. Technol. A 41(6) Nov./Dec. 2023, 063002 pp. 1-15.*

Astaneh, Sarah Hashemi, et al., "Simple masking method for selective atomic layer deposition of thin films". J. Vac. Sci. Technol. B38(2) Mar./Apr. 2020, 025001, pp. 1-6.*

Nadhom, Hama, et al., "Area selective deposition of iron films using temperature sensitive masking materials and plasma electrons as reducing agents". J. Vac. Sci. Technol. A 39(4) Jul./Aug. 2021, 043411, pp. 1-6.*

Giedraitiene, Agne, et al., "Antimicrobial Properties of CuO Particles Deposited on a Medical Mask". Materials, 2022, 15, 7896, pp. 1-14.*

International Search Report and Written Opinion, PCT No. PCT/US2024/051170, Mailed Jan. 20, 2025, Total Pages 13.

* cited by examiner

SELECTIVE NON-PLASMA DEPOSITION OF MASK PROTECTION MATERIAL

TECHNICAL FIELD

The present invention relates generally to protection of etch masks, and, in particular embodiments, to systems and methods for selectively depositing a mask protection material using non-plasma treatments.

BACKGROUND

Microelectronic device fabrication typically involves a series of manufacturing techniques that include formation, patterning, and removal of a number of layers of material on a substrate. Etch masks may be formed (e.g., deposited, grown, patterned) to protect regions of the substrate and allow for pattern transfer via etching. Wet or dry etching processes may be used, with plasma etching processes being an example of a dry etching process. Etching processes that etch dielectric materials are often used to create electrical (e.g., conductive) connections between and within layers.

The overall yield of the fabrication process is affected by both the quality of the features formed during etching processes (the etch profile) and the uniformity of the process across the substrate. Mask loss (due to the mask material being etched away during the etching process) can degrade the etch profile and decrease uniformity, both of which lower the yield of acceptable devices during the fabrication. Mask loss may be especially pronounced when employing high bias power, such as during a high-aspect ratio (HAR) etch, which may be used for important fabrication steps like high-aspect ratio contact (HARC) etches.

One conventional method of combatting mask loss is to use a different material as the bulk material of the mask, but this can be more complicated and/or more expensive. Another conventional method is to increase the mask thickness, but this can have negative impacts on the patterning capabilities of the mask itself as well as the attainable aspect ratio and critical dimension (CD) for the etched features. Carbon deposition during the etching process can also afford some mask protection, the carbon is deposited on all surfaces (i.e., non-selectively) including the material being etched and therefore can work against the etching process even as it may protect the mask to some extent.

Therefore, improved deposition methods for mask protection materials that selectively deposit on the mask (and not on the etch target material) to improving selectivity may be desirable.

SUMMARY

In accordance with an embodiment of the invention, a method includes performing a non-plasma vapor treatment and performing a non-plasma halide treatment. During the non-plasma vapor treatment, a mask having openings exposing an underlying layer is treated with a non-plasma vapor to selectively deposit a first component of a mask protection material on the mask. During the non-plasma halide treatment, the mask and the underlying layer are treated with a non-plasma halide gas to selectively deposit a second component of the mask protection material on the mask.

In accordance with another embodiment of the invention, a method includes performing a pretreatment, performing a non-plasma vapor treatment, and performing a non-plasma halide treatment. During the pretreatment, a carbon-based mask having openings exposing an underlying layer is treated with a remote plasma species to selectively form a reactive surface on the carbon-based mask. The reactive surface is treated with a non-plasma nitrogen- or oxygen-containing vapor during the non-plasma vapor treatment to deposit a first component and form a vapor-treated surface on the carbon-based mask. During the non-plasma halide treatment, the vapor-treated surface is treated with a non-plasma halide gas to deposit a second component and form a mask protection material on the carbon-based mask. The mask protection material includes both the first component and the second component.

In accordance with still another embodiment of the invention, a method includes performing a non-plasma metal halide treatment and performing a non-plasma vapor treatment. During the non-plasma halide treatment, a carbon-based mask having openings exposing an underlying layer is treated with a non-plasma metal halide gas to deposit a first component and form a halide-treated surface on the carbon-based mask. During the non-plasma vapor treatment, the halide-treated surface is treated with a non-plasma nitrogen- or oxygen-containing vapor to deposit a second component and form a mask protection material on the carbon-based mask. The mask protection material includes both the first component and the second component.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates an example deposition process schematically showing a non-plasma vapor treatment and a non-plasma halide treatment used to selectively deposit a mask protection material on a patterned mask in accordance with embodiments of the invention;

Figure 4:
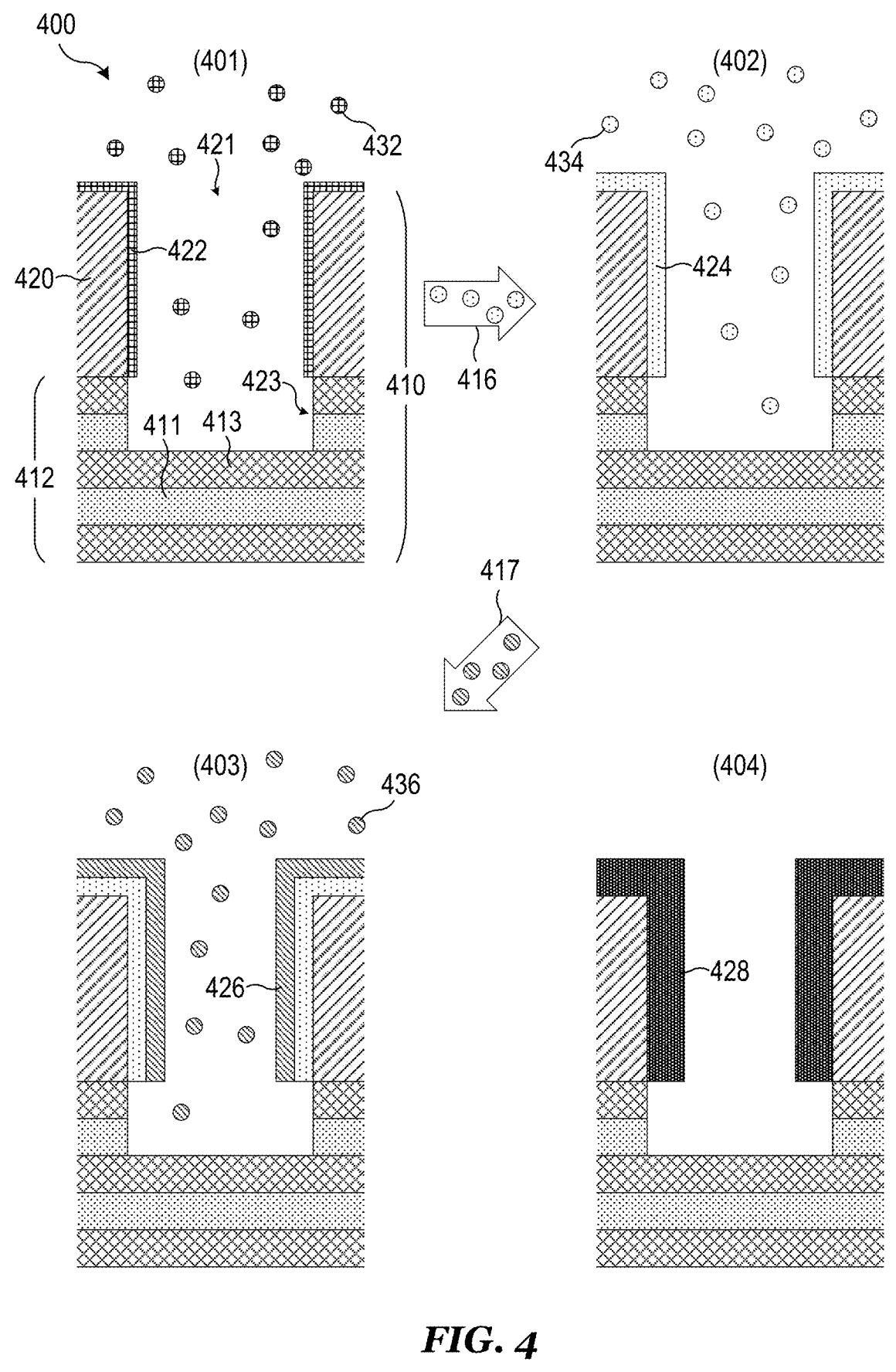

FIG. 4 illustrates an example deposition process schematically showing a remote plasma pretreatment and a non-plasma vapor treatment performed before a non-plasma halide treatment that are used to selectively deposit a mask protection material on a patterned mask in accordance with embodiments of the invention;

FIG. 5 illustrates a specific example of a deposition process schematically showing a remote plasma pretreatment and a non-plasma vapor treatment performed before a non-plasma halide treatment that are used to selectively deposit a mask protection material on a patterned mask in accordance with embodiments of the invention;

FIG. 8 illustrates an example deposition process schematically showing an optional pretreatment and a non-plasma metal halide treatment performed before a non-plasma vapor treatment that are used to selectively deposit a mask protection material on a patterned mask in accordance with embodiments of the invention;

FIG. 9 illustrates a specific example of a deposition process schematically showing an optional pretreatment and a non-plasma metal halide treatment performed before a non-plasma vapor treatment that are used to selectively deposit a mask protection material on a patterned mask in accordance with embodiments of the invention;

FIG. 10 illustrates another specific example of a deposition process schematically showing an optional pretreatment and a non-plasma metal halide treatment performed before a non-plasma vapor treatment that are used to selectively deposit a mask protection material on a patterned mask in accordance with embodiments of the invention.

Figure 1:
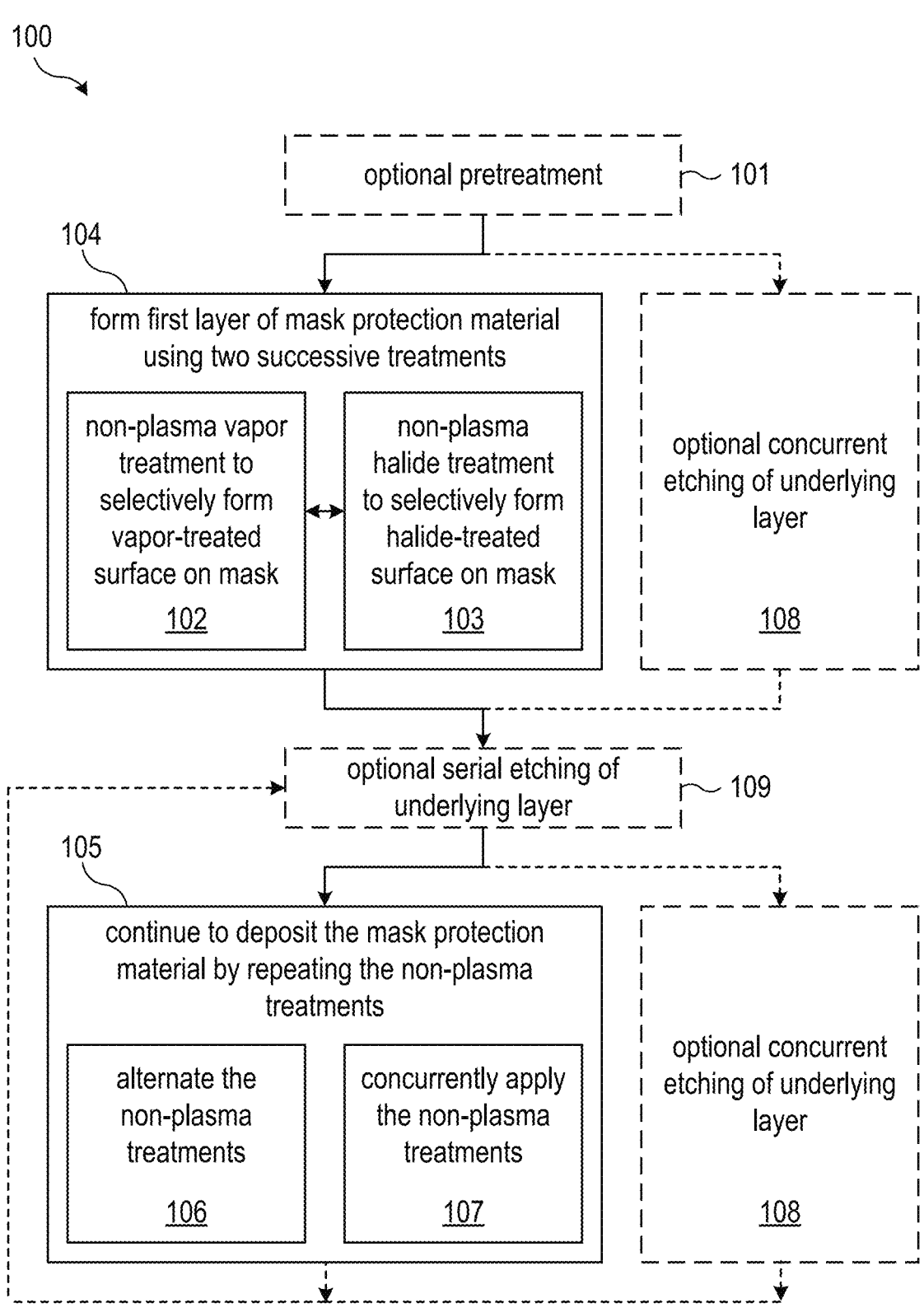
FIG. 1 illustrates an example method that includes performing a vapor treatment and a halide treatment on a patterned mask to selectively deposit a mask protection material where both treatments are non-plasma treatments in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

Mask loss can lead to degraded etch profile and reduced uniformity during etching processes of a target material. Although not strictly required, the mask material is often chosen so that it etches at a slower rate than the target material (i.e., the etch selectivity of the mask material relative to the target material, defined as ratio of etch rates between two materials using a given etching process, is greater than one and may be much greater than one). The ability of the mask material to function as an etch mask depends on the mask material continuing to cover the regions of the target material that are not intended to be etched.

As the etching process proceeds some mask material is etched away while the target material is etched. The effect of higher mask selectivity is to reduce the amount of mask material that is etched for a given amount of etched target material. However, simply choosing mask materials with higher selectivity may not be an option due to the myriad of other considerations that are accounted for when choosing a mask material. Without the ability to improve mask selectivity, the mask thickness may also be increased, but this also comes with drawbacks, including potentially reducing achievable CD and or aspect ratio of the features.

Instead, mask protection materials may be deposited before the etching process and/or in situ during the etching process to slow the etch rate of the mask material. One category of mask protection material is carbon-based material deposited during the etching process (e.g., as a side-effect of using carbon-containing etchants, such as fluorocarbons or hydrofluorocarbons, as in dielectric etches, for example). Yet, deposition of carbon-based materials is not a selective process resulting in carbon-based material also being deposited on the target material (such as sidewalls and the etch front). Moreover, carbon-based materials do not provide a sufficient selectivity benefit in fluorine- and/or hydrogen-rich plasma etching environments.

In accordance with various embodiments herein described, the invention proposes a mask protection material deposition process that selectively deposits on the mask material using two non-plasma treatments. In various embodiments, a method for selectively depositing a mask protection material includes a non-plasma vapor treatment and a non-plasma halide treatment, performed sequentially (but in either order). The non-plasma vapor treatment includes treating a mask having openings exposing an underlying layer with a non-plasma vapor (i.e., a material in vapor form with none of the material in plasma form) to selectively deposit a first component of a mask protection material on the mask. That is, some or all of the constituent elements of the vapor are selectively deposited during the non-plasma vapor treatment (i.e. on the mask, but not on the on the underlying layer). Similarly, the non-plasma halide treatment includes treating the mask and the underlying layer with a non-plasma halide gas (i.e., a gas that includes a halide, but with none of the halide in plasma form) to selectively deposit a second component of the mask protection material on the mask.

The proposed systems and methods differ from other conventional methods. For example, tungsten fluoride has been included in an etch gas. However, the tungsten fluoride formed into a plasma along with the etch gas and is used to passivate sidewalls (i.e. deposit material on sidewalls of the features), which is different than the selective non-plasma deposition of mask protection material presently described. Another conventional method is to perform atomic layer deposition (ALD) of a protective film in between etch steps. Yet again, the ALD process uses a plasma deposition phase and the protective film is not selective since it is conformal to the feature sidewalls by design.

The systems and methods described herein for selectively depositing a mask protection material may advantageously utilize new protecting chemistry relative to conventional (e.g., carbon deposition) mask protection materials. For example, the mask protection material of the proposed deposition processes may be a dielectric, such as an oxide or a nitride, and may include a metal, such as titanium or tungsten, but may also include metalloids such as boron and nonmetals. The deposition processes may advantageously exhibit good selectivity to the mask material during deposition (i.e., relative to the target material of an underlying layer). This may be a particular advantage relative to conventional carbon deposition processes used for mask protection. A further potential advantage of the mask protection material deposited using the systems and methods as described is higher etch resistance (e.g., in fluorine-driven etch reactions, in fluorine- and/or hydrogen-rich environments, etc.). Improved etch selectivity may be especially beneficial when etching dielectric materials including stacks of dielectric materials like an ONON stack (alternative oxide layers and nitride layers) or an OPOP stack (alternating oxide layers and polysilicon layers).

Figure 11:
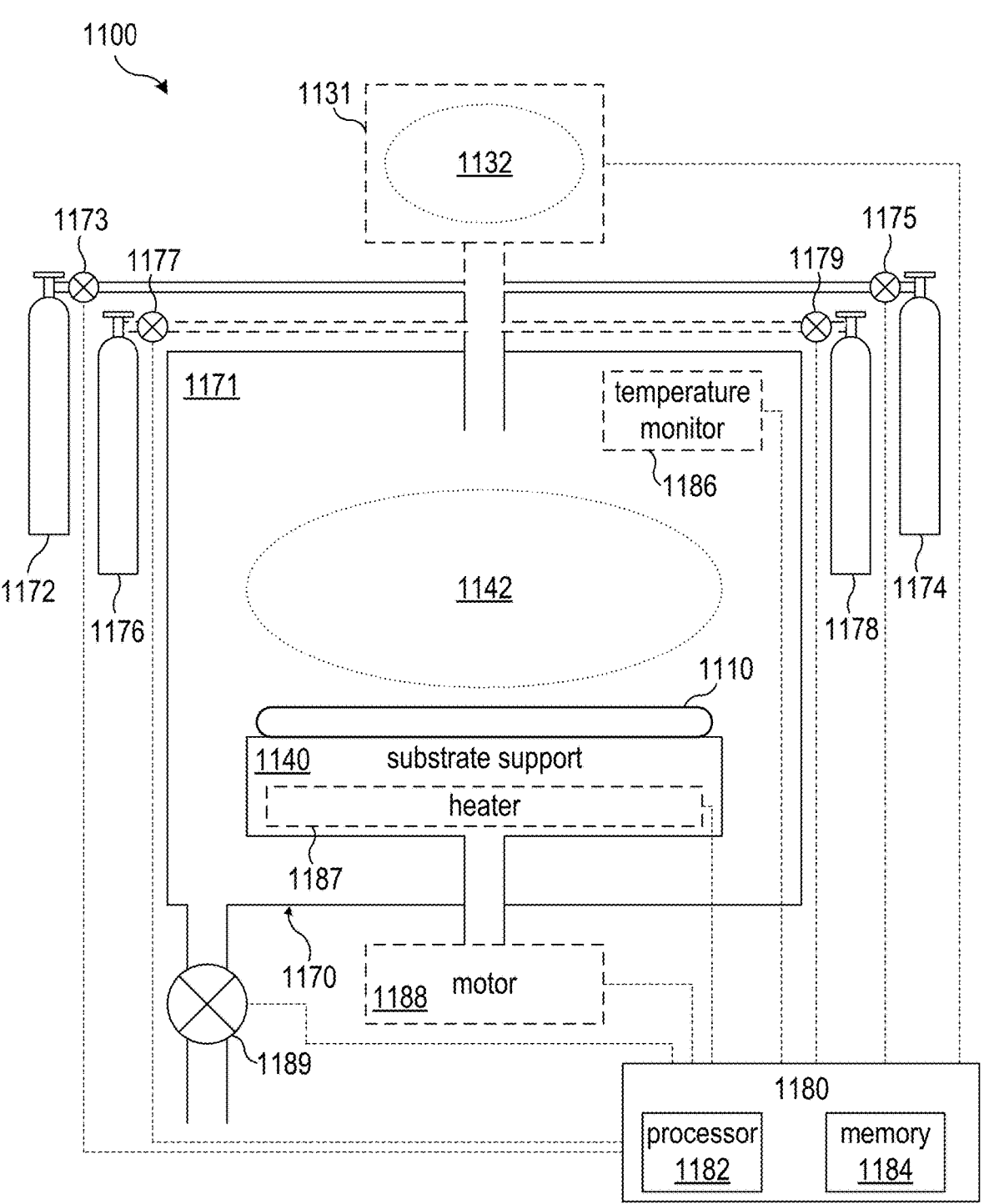
FIG. 11 illustrates an example deposition system that includes a deposition chamber within which deposition processes including a non-plasma vapor treatment and a non-plasma halide treatment used to selectively deposit a mask protection material on a patterned mask may be performed in accordance with embodiments of the invention.

Embodiments provided below describe various methods and systems for selectively depositing a mask protection material, and in particular embodiments, systems and methods for selectively depositing a mask protection material that include a non-plasma vapor treatment and a non-plasma halide treatment. The following description describes the embodiments. FIG. 1 is used to describe an example method of selectively depositing a mask protection material. An example deposition process schematically showing an implementation of the example method is described using FIG. 2. An example method of selectively depositing a mask protection material that includes performing a non-plasma vapor treatment before a non-plasma halide treatment is described using FIG. 3 while a corresponding example deposition process is described using FIG. 4. Two specific examples of the deposition process of FIG. 4 are described using FIGS. 5 and 6. An example method of selectively depositing a mask protection material that includes performing a non-plasma metal halide treatment before performing a non-plasma vapor treatment is described using FIG. 7 with FIG. 8 being used to describe a corresponding example deposition process and FIGS. 9 and 10 being used to describe two specific examples of the example deposition process. FIG. 11 is used to describe a deposition system that can be used to perform the methods and processes described herein.

FIG. 1 illustrates an example method that includes performing a vapor treatment and a halide treatment on a patterned mask to selectively deposit a mask protection material where both treatments are non-plasma treatments in accordance with embodiments of the invention. The method of FIG. 1 may be combined with other methods and performed using the systems and apparatuses as described herein. For example, the method of FIG. 1 may be combined with any of the embodiments of FIGS. 2-11. Although shown in a logical order, the arrangement and numbering of the steps of FIG. 1 are not intended to be limited. The method steps of FIG. 1 may be performed in any suitable order or concurrently with one another as may be apparent to a person of skill in the art.

Referring to FIG. 1, a method 100 may be used to selectively deposit a mask protection material on a mask. A first layer of the mask protection material is formed (step 104) using two successive treatments: a non-plasma vapor treatment 102 and a non-plasma halide gas treatment 103, which may be performed in either order. During the non-plasma vapor treatment 102, a patterned mask (i.e., a mask having openings exposing an underlying layer) is treated with a non-plasma vapor to selectively deposit a component of the mask protection material on the mask. Another component of the mask protection material is selectively deposited during the non-plasma halide gas treatment 103 by treating the mask and the underlying layer with a non-plasma halide gas.

After the first layer of the mask protection material is deposited in step 104, the non-plasma treatments (i.e., the non-plasma vapor treatment 102 and the non-plasma halide gas treatment 103) may be repeated to continue the deposition of the mask protection material (step 105). This may be accomplished by alternating the non-plasma treatments (step 106) as part of a cycle, by concurrently applying the non-plasma treatments (step 107), or some combination thereof (such as by continually applying one of the treatments and pulsing the other treatment).

An optional pretreatment 101 may be performed before step 104. For example, exposed surfaces of both the mask and the underlying layer may initially be in an undesirable state for the selective deposition of the first layer of the mask protection material (e.g., exposed surfaces of the mask may be unreactive, exposed surfaces of the underlying layer may be too reactive, etc.). The optional pretreatment 101 may be included to prepare one or both of the mask surfaces and underlying layer surfaces for the deposition of the first layer of the mask protection material. In various embodiments, the optional pretreatment 101 includes pretreating the mask and the underlying layer to selectively form a reactive surface on the mask before performing both the non-plasma vapor treatment and the non-plasma halide treatment.

In some cases, the optional pretreatment 101 may itself be a selective process. The pretreated surfaces of the mask and/or the underlying layer may then facilitate or enhance the selectivity of the rest of the process by creating thermodynamically favorable conditions for reactions on mask surfaces but not on underlying layer surfaces (e.g., by modifying, such as lowering, one or more reaction barriers). It should be noted that while the non-plasma vapor treatment 102 and the non-plasma halide gas treatment 103 are specifically non-plasma treatments, the optional pretreatment 101 may use plasma (e.g., remote plasma, such as a chlorine plasma, hydrogen plasma, oxygen plasma, or a mixture thereof). Alternatively, the optional pretreatment 101 may also be a non-plasma treatment, such as exposing the mask and the underlying layer to water ($H_2O$) vapor.

The order of the non-plasma vapor treatment 102 and the non-plasma halide gas treatment 103 may vary depending on the particular implementation. For example, the specific reaction pathways for the formation of a particular desired mask protection material may influence whether the non-plasma vapor treatment 102 or the non-plasma halide gas treatment 103 is performed first (as well as what type of optional pretreatment 101, if it is included).

When the non-plasma vapor treatment 102 is performed first, the surface of the mask (whether an unreactive surface or a reactive surface, such as formed using a pretreatment) is treated with the non-plasma vapor to form a vapor-treated surface including a first component (e.g., oxygen, nitrogen, etc.) and then the vapor-treated surface is treated with the non-plasma halide gas during the non-plasma halide gas treatment 103 to add a second component (e.g., boron, titanium, tungsten, etc.) that together with the first component forms the mask protection material on the mask. In contrast, when the non-plasma halide gas treatment 103 is performed first, the surface of the mask is treated with the metal halide gas to form a halide-treated surface including a first component (e.g., boron, titanium, tungsten, etc.) and then the halide-treated surface is treated with the non-plasma vapor during the non-plasma vapor treatment 102 to add a second component (e.g., oxygen, nitrogen, etc.) to form the mask protection material on the mask.

The patterned mask may be used as an etch mask (e.g., during a dry etch process, such as a plasma etching process). Indeed, the mask protection material may be used to protect the mask during the etching process. The etching can occur after step 104 (i.e. after the first layer of the mask protection material has been formed on the mask) as shown using optional serial etch step 109. Alternatively or additionally, etching may take place during step 104, as shown by optional concurrent etch step 108. The optional concurrent etch step 108 may also be performed during the step 105, whether the treatments continue to alternate (step 106), or are mixed for a period of time (step 107) to concurrently deposit more mask protection material even as it is etched away by the optional concurrent etch step 108.

Figure 2:
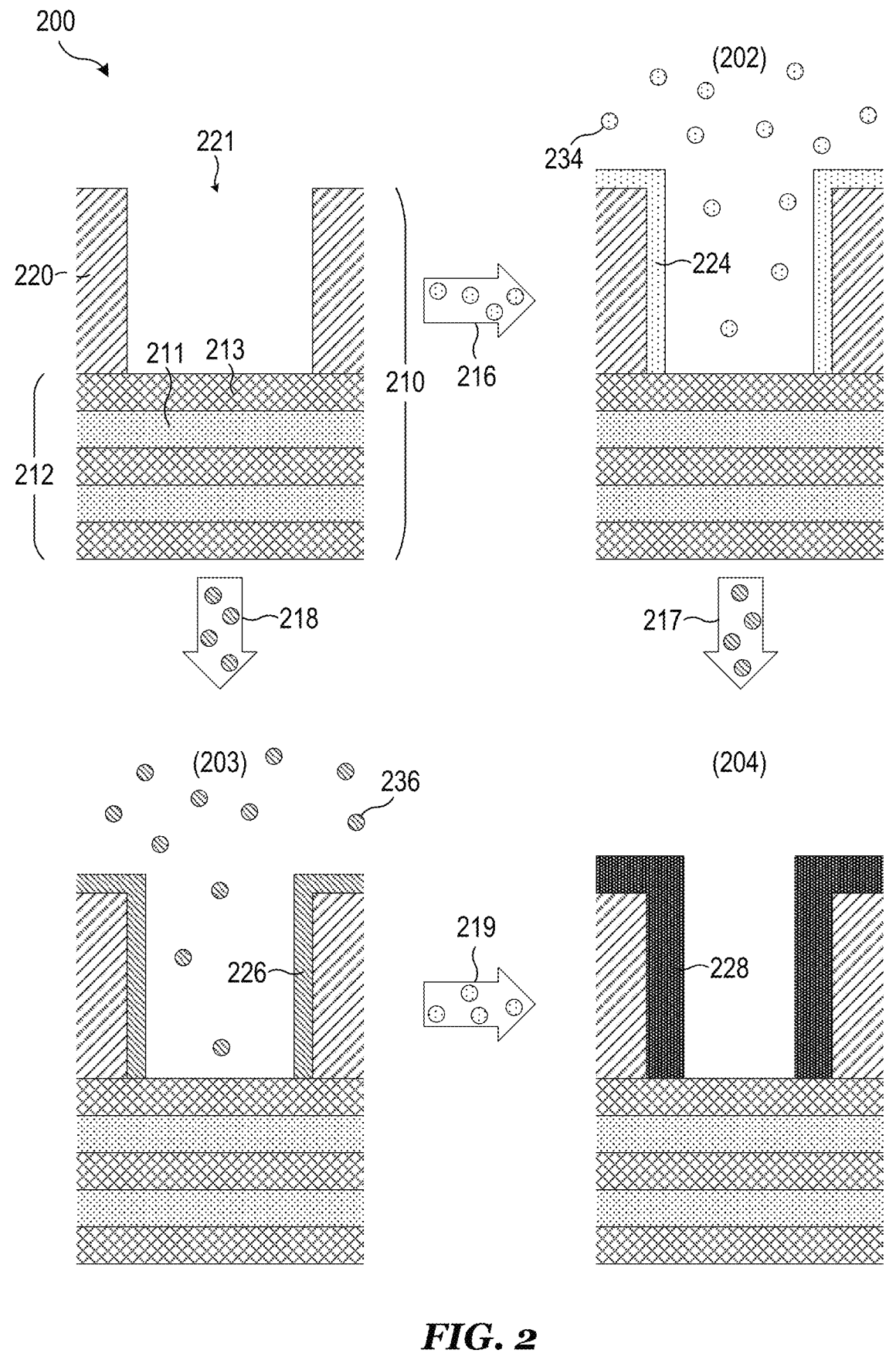

FIG. 2 illustrates an example deposition process schematically showing a non-plasma vapor treatment and a non-plasma halide treatment used to selectively deposit a mask protection material on a patterned mask in accordance with embodiments of the invention. The deposition process of FIG. 2 may include specific implementations of methods described herein such as the method of FIG. 1, for example. Similarly labeled elements may be as previously described.

Referring to FIG. 2, a deposition process 200 includes a non-plasma vapor treatment 202 and a non-plasma halide gas treatment 203 that result in the formation of a first layer of a mask protection material 228 (step 204). It should be noted that here and in the following a convention has been adopted for brevity and clarity wherein elements adhering to the pattern [x02] where 'x' is the figure number may be related implementations of a non-plasma vapor treatment in various embodiments. For example, the non-plasma vapor treatment 202 may be similar to the non-plasma vapor treatment 102 except as otherwise stated. An analogous convention has also been adopted for other elements as made clear by the use of similar terms in conjunction with the aforementioned numbering system.

At the top left of FIG. 2, a substrate 210 including a mask 220 disposed on an underlying layer 212 is shown. The mask 220 is a patterned mask, including openings 221 through which the underlying layer 212 is exposed. In the non-plasma vapor treatment 202, the mask 220 and the underlying layer 212 are treated with a non-plasma vapor 234 to form a vapor-treated surface 224. That is, some component of the non-plasma vapor 234 is selectively deposited on the mask 220 to form the vapor-treated surface 224. Similarly, in the non-plasma halide gas treatment 203, the mask 220 (including any layers or surface modifications that have already occurred) and the underlying layer 212 are treated with a non-plasma halide gas 236 to form a halide-treated surface 226 (by depositing some component of the non-plasma halide gas 236 on the mask 220).

As previously discussed, the non-plasma vapor treatment 202 and the non-plasma halide gas treatment 203 may be performed in either order. In the vapor-first option (step 216), the non-plasma vapor treatment 202 is performed first forming the vapor-treated surface 224 and then the vapor-treated surface 224 is treated with the non-plasma halide gas 236 (step 217) to form the mask protection material 228 on the mask 220. In the halide-first option (step 218), the non-plasma halide gas treatment 203 is performed first forming the halide-treated surface 226, which is then treated with the non-plasma vapor 234 (step 219) to form the mask protection material 228 on the mask 220.

The underlying layer 212 may be included as part of the substrate 210 (e.g., as shown or supported by another layer, which may be a semiconductor layer, such as a device layer, of a wafer, for example). The substrate 210 may be any suitable substrate, such as an insulating, conducting, or semiconducting substrate with one or more layers disposed thereon. For example, the substrate 210 may be a semiconductor wafer, such as a silicon wafer, and include various layers, structures, and devices (e.g., forming integrated circuits). In one embodiment, the substrate 210 includes silicon. In another embodiment, the substrate 210 includes silicon germanium (SiGe). In still another embodiment, the substrate 210 includes gallium arsenide (GaAs). Of course, many other suitable materials, semiconductor or otherwise, may be included in the substrate 210 as may be apparent to those of skill in the art.

The underlying layer 212 may be any suitable material or combination of materials. In various embodiments, the underlying layer 212 includes an oxide material, and the underlying layer 212 includes silicon dioxide ($SiO_2$) in one embodiment, and includes tetraethyl orthosilicate (TEOS) in one embodiment. In some embodiments, the underlying layer 212 includes a nitride material, and includes silicon nitride ($Si_3N_4$) in one embodiment. Of course, other classes of dielectric material may also be included in the underlying layer 212, such as an oxynitride material (e.g., silicon oxynitride ($SiO_xN_y$), and others).

The underlying layer 212 may include more than one type of material (even including materials not necessarily acting as or classified as dielectric materials so long as the underlying layer 212 may be selectively etched. In some specific applications, such as HARC etches, the underlying layer 212 may be a stack of several layers of dielectric material. One specific example is an ONON stack, which includes alternating oxide layers 211 (e.g., $SiO_2$) and nitride layers 213 (e.g., $Si_3N_4$), as shown. Another stack of materials that may be used as the underlying layer 212 is an OPOP stack, which includes alternating oxide layers and polysilicon layers.

The openings 221 of the mask 220 are configured to be used to etch a desired pattern into the underlying layer 212. The mask 220 may be any suitable mask that is configured to protect regions of the underlying layer 212 while allowing the underlying layer 212 to be etched through the openings 221 during an etching process. In various embodiments, the mask 220 is a hardmask, such as an amorphous carbon layer (ACL) or an MHM (metal hardmask). The mask 220 may be electrically conductive, semiconducting, or insulating.

In various embodiments, the mask 220 is a carbon-based mask and is an ACL in one embodiment. Other possible carbon-based masks include diamond-like carbon masks, spin-on-carbon (SoC) masks, and the like. In one embodiment, the underlying layer 212 does not include carbon, which may be advantageous for improving deposition selectivity during the deposition process 200 in certain implementations, such as when the mask 220 is a carbon-based mask.

Deposition selectivity during the non-plasma vapor treatment 202 and/or the non-plasma halide gas treatment 203 may be achieved by selecting deposition materials for which surfaces of the mask 220 are reactive surfaces and for which surfaces of the underlying layer 212 are unreactive surfaces. For example, at the stage of the deposition process 200 depicted in the top left of FIG. 2, surfaces of the underlying layer 212 may be terminated with an unreactive terminated species (e.g., hydrogen-terminated oxide and hydrogen-terminated nitride in the specific example of the ONON stack shown here).

Whether the non-plasma vapor treatment 202 or the non-plasma halide gas treatment 203, the following treatment step may include reaction chemistry that is favorable (e.g., thermodynamically favorable) for preferentially reacting with the mask 220 while little or no reaction with the underlying layer 212 takes place. For example, the non-plasma vapor 234 may include a nitrogen-based or an oxygen-based vapor resulting in a nitrogen-terminated or oxygen-terminated vapor-treated surface 224 (i.e., the nitrogen or oxygen would be the deposited component of the mask protection material 228). In one embodiment, the non-plasma vapor 234 includes water ($H_2O$) vapor. In one embodiment, the non-plasma vapor 234 includes ammonia ($NH_3$) vapor.

Similarly, the non-plasma halide gas 236 may include a Y-halogen (one or more halogens bonded with one or more Y species). The halide-treated surface 226 may then be Y-terminated (i.e., the Y component(s) would be the deposited component of the mask protection material 228). In one embodiment, the non-plasma halide gas 236 is boron chloride (such as boron trichloride, BCl3). In various embodiments, the non-plasma halide gas 236 is a metal halide gas and is titanium chloride (such as titanium tetrachloride, TiCl4) in one embodiment, and is tungsten fluoride (such as tungsten hexafluoride, WF6) in one embodiment. Of course, a wide variety of compounds meeting the Y-halogen pattern may be usable as the non-plasma halide gas 236 depending on the specific requirements of a given application.

Figure 3:
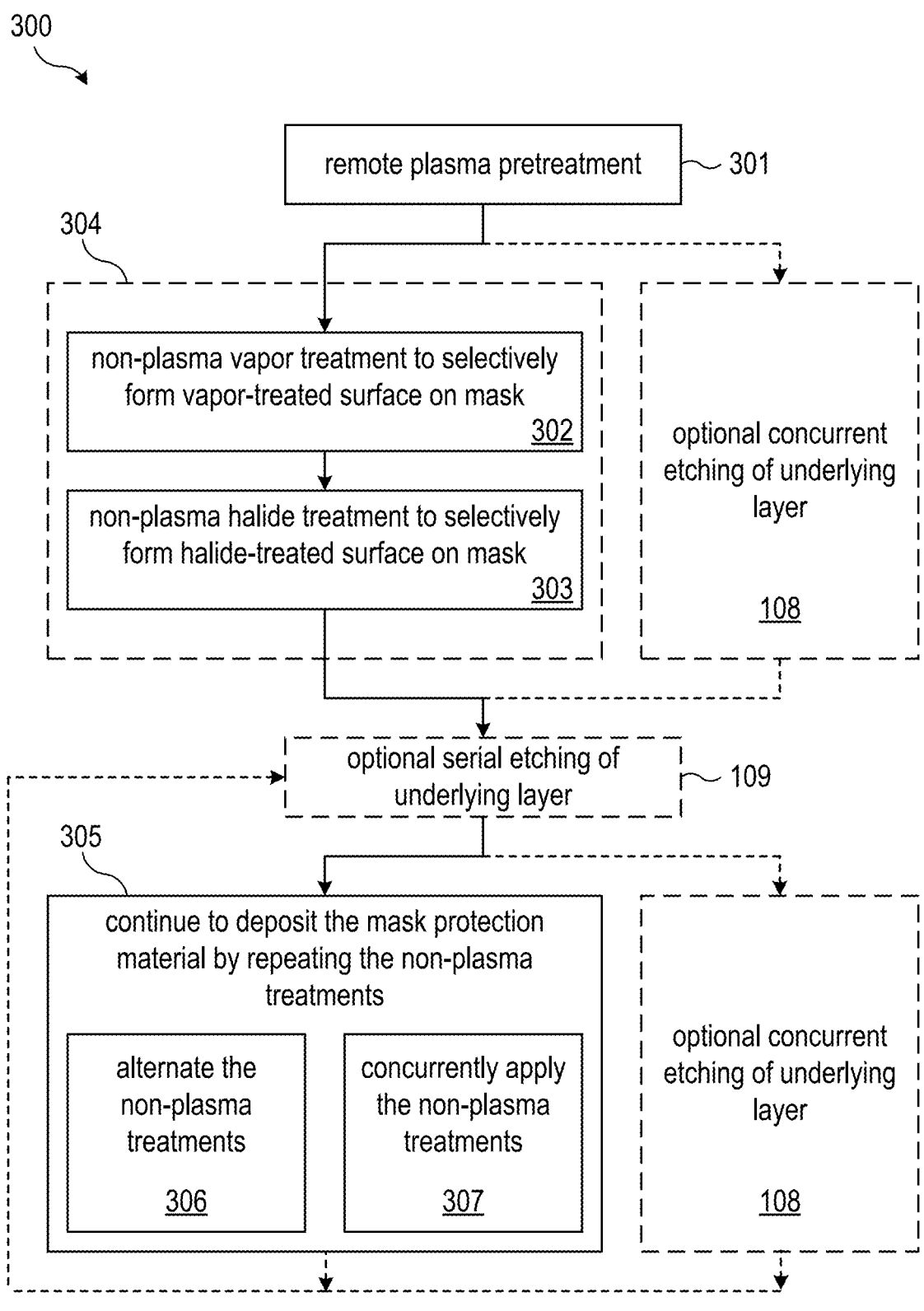
FIG. 3 illustrates an example method that includes performing a vapor treatment before performing a halide treatment on a patterned mask to selectively deposit a mask protection material where both treatments are non-plasma treatments in accordance with embodiments of the invention.

FIG. 3 illustrates an example method that includes performing a vapor treatment before performing a halide treatment on a patterned mask to selectively deposit a mask protection material where both treatments are non-plasma treatments in accordance with embodiments of the invention. The method of FIG. 3 may be combined with other methods and performed using the systems and apparatuses as described herein. For example, the method of FIG. 3 may be combined with any of the embodiments of FIGS. 1-2 and 4-11. Although shown in a logical order, the arrangement and numbering of the steps of FIG. 3 are not intended to be limited. The method steps of FIG. 3 may be performed in any suitable order or concurrently with one another as may be apparent to a person of skill in the art. Similarly labeled elements may be as previously described.

Referring to FIG. 3, a method 300 may be used to selectively deposit a mask protection material on a mask. The method 300 may be a specific implementation of the method 100 where a remote gas pretreatment 301 is included and where the first treatment of the process to form the first layer of the mask protection material (step 304) is a non-plasma vapor treatment 302 which is then followed by a non-plasma halide gas treatment 303.

The remote gas pretreatment 301 includes treating a mask (e.g., a carbon-based mask) having openings exposing an underlying layer with a remote plasma species (e.g., chlorine) to selectively form a reactive surface on the carbon-based mask. The non-plasma vapor treatment 302 then includes treating the reactive surface with a non-plasma vapor (e.g., a nitrogen- or oxygen-containing vapor such as ammonia vapor or water vapor) to deposit a first component and form a vapor-treated surface on the mask. After the forming the vapor-treated surface, the non-plasma halide gas treatment 303 includes treating the vapor-treated surface with a non-plasma halide gas (e.g., boron chloride gas or titanium chloride gas) to deposit a second component and form a mask protection material on the mask (the mask protection material includes both the first component and the second component).

After the first layer of the mask protection material is deposited in step 304, the non-plasma treatments (i.e., the non-plasma vapor treatment 302 and then the non-plasma halide gas treatment 303) may be repeated to continue the deposition of the mask protection material (step 305). As before, this may be accomplished by alternating the non-plasma treatments (step 306) as part of a cycle, by concurrently applying the non-plasma treatments (step 307), or some combination thereof (such as by continually applying one of the treatments and pulsing the other treatment).

FIG. 4 illustrates an example deposition process schematically showing a remote plasma pretreatment and a non-plasma vapor treatment performed before a non-plasma halide treatment that are used to selectively deposit a mask protection material on a patterned mask in accordance with embodiments of the invention. The deposition process of FIG. 4 may include specific implementations of methods described herein such as the method of FIG. 1, for example. Similarly labeled elements may be as previously described.

Referring to FIG. 4, a deposition process 400 includes a remote plasma treatment 401, a non-plasma vapor treatment 402, and a non-plasma halide gas treatment 403 that result in the formation of a first layer of a mask protection material 428 (step 404). The deposition process 400 is an example of a vapor-first option (step 416) where a halide reacts with a vapor-treated surface (step 417). During the remote plasma treatment 401, a substrate 410 that includes a mask 420 with openings 421 through which an underlying layer 412 is exposed is pretreated with a remote plasma species 432 (such as chlorine). The remote plasma species 432 reacts with the mask 420 to form a reactive surface 422, but does not react (or reacts little) with an unreactive underlying termination 423 of the underlying layer 412, such as unreactive termination of oxide layers 411 and nitride layers 413 of an ONON stack, as shown (another example of a stack would be an OPOP stack of alternating oxide and polysilicon layers).

The reactive surface 422 and the unreactive underlying termination 423 are treated with a non-plasma vapor 434 during the non-plasma vapor treatment 402 to form a vapor-treated surface 424. Since the remote plasma treatment 401 formed the reactive surface 422 on the mask 420 and not the underlying layer 412, the non-plasma vapor 434 has no significant reaction with the underlying layer 412 during the non-plasma vapor treatment 402 and the vapor-treated surface 424 is only formed on the mask 420. Similarly, when the vapor-treated surface 424 is treated with a non-plasma halide gas 436 to form a halide-treated surface 426 during the non-plasma halide gas treatment 403, the halide-treated surface 426 is only formed on the mask 420 (i.e., selectively deposited on the mask 420 to form the mask protection material 428 as shown in step 404 as a single mask protection material). Of course, the non-plasma vapor treatment 402 and the non-plasma halide gas treatment 403 may be repeated (alternating, concurrently, etc.) to deposit more of the mask protection material 428 before and/or during an etching process.

Figure 5:
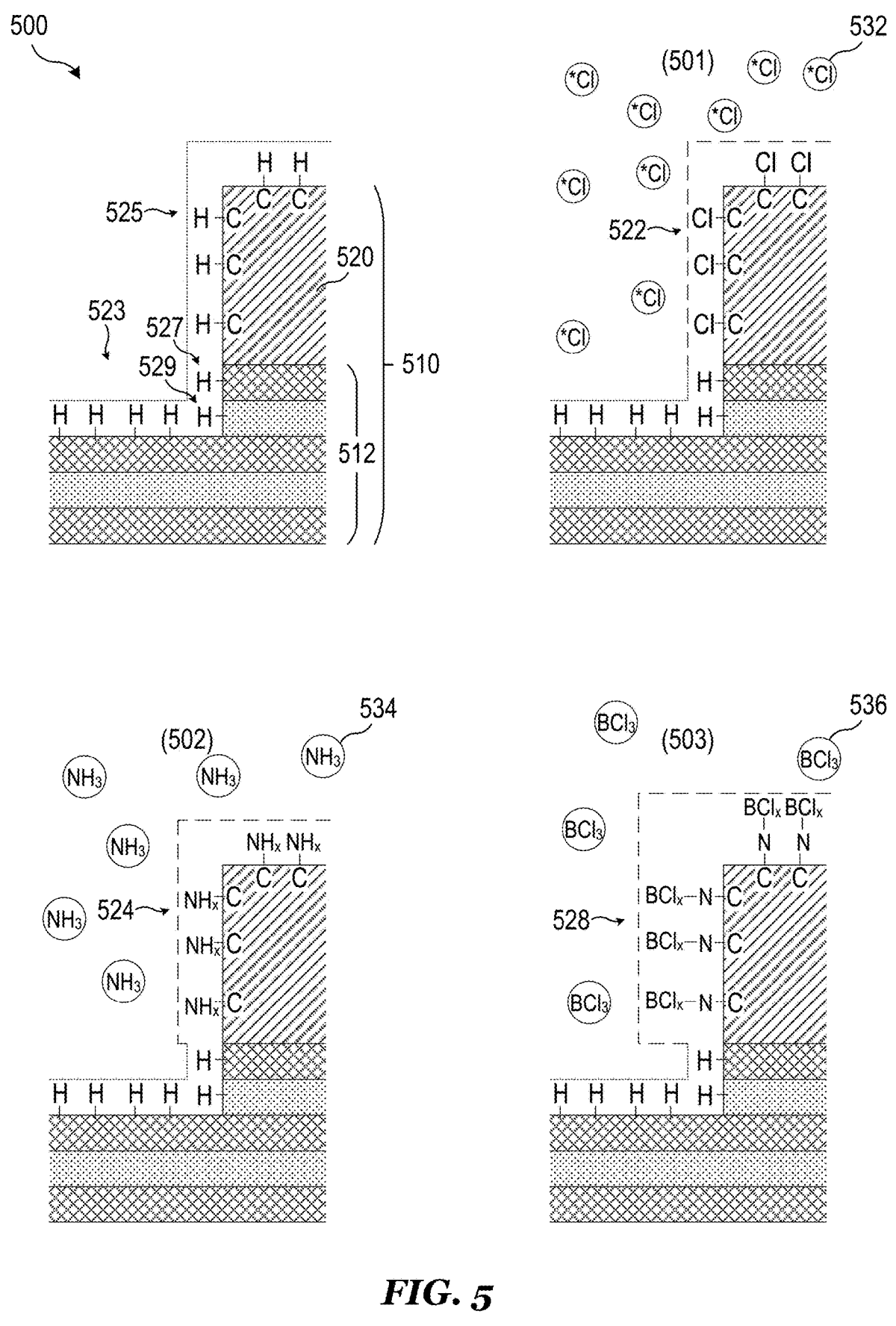

FIG. 5 illustrates a specific example of a deposition process schematically showing a remote plasma pretreatment and a non-plasma vapor treatment performed before a non-plasma halide treatment that are used to selectively deposit a mask protection material on a patterned mask in accordance with embodiments of the invention. The deposition process of FIG. 5 may be a specific implementation of other deposition processes described herein such as the deposition process of FIG. 4, for example. Similarly labeled elements may be as previously described.

Referring to FIG. 5, a deposition process 500 includes a remote plasma pretreatment 501, a non-plasma vapor treatment 502, and a non-plasma halide gas treatment 503 that result in the formation of a first layer of a mask protection material 528. During the remote plasma pretreatment 501, a substrate 510 that includes a carbon-based mask 520 on an underlying layer 512 (here, an ONON stack, but it may also be an OPOP stack, a bulk material, or another configuration) is pretreated with reactive chlorine 532 (chlorine from remote plasma, such as chlorine ions, chorine radicals). The reactive chlorine 532 reacts with hydrogen-terminated carbon 525 of the carbon-based mask 520 to form a chlorine-terminated surface 522 (a reactive surface), but does not react (or reacts little) with an unreactive underlying termination 523 of the underlying layer 512 (here, including hydrogen-terminated oxide 527 and hydrogen-terminated nitride 529).

The chlorine-terminated surface 522 and the unreactive underlying termination 523 are treated with an ammonia vapor 534 (a non-plasma vapor) during the non-plasma vapor treatment 502 to form an amine-functionalized surface 524. When the amine-functionalized surface 524 is treated with a boron chloride gas 536 to form a mask protection material 528 is formed (e.g., a completed mask protection material, which here is boron nitride, and that has a halide-terminated surface which can be reacted with a subsequent repeated non-plasma vapor treatment 502 to continue the deposition).

In the specific example of the deposition process 500 a remote Cl2 plasma chloridizes a C-based surface to enhance the C—N layer formation in NH3 gas, which in turn facilitates the selective deposition of the nitride on carbon. The first layer may be formed through the C-Cl+NH3=C—NH2+HCl reaction. The completed first layer of the boron nitride mask protection material is formed through the C-NH2+BCl3=C—NH-BCl2+HCl reaction. The C—Cl bond is favored for reacting with the ammonia vapor 534 in this approach over C—F/C—H bonds. Further, the deposition process 500 may have the advantage that the remote Cl-plasma treatment may be self-limiting on an ONON or OPOP stack.

Figure 6:
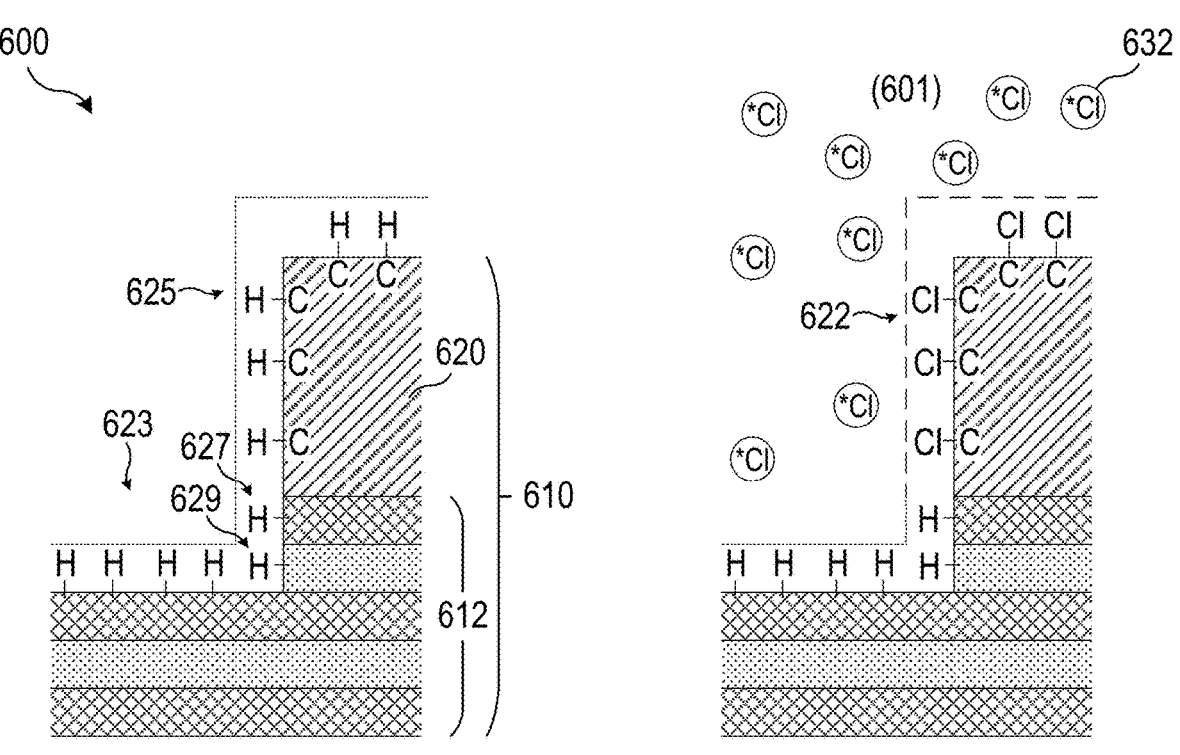
FIG. 6 illustrates another specific example of a deposition process schematically showing a remote plasma pretreatment and a non-plasma vapor treatment performed before a non-plasma halide treatment that are used to selectively deposit a mask protection material on a patterned mask in accordance with embodiments of the invention.
Figure 6:
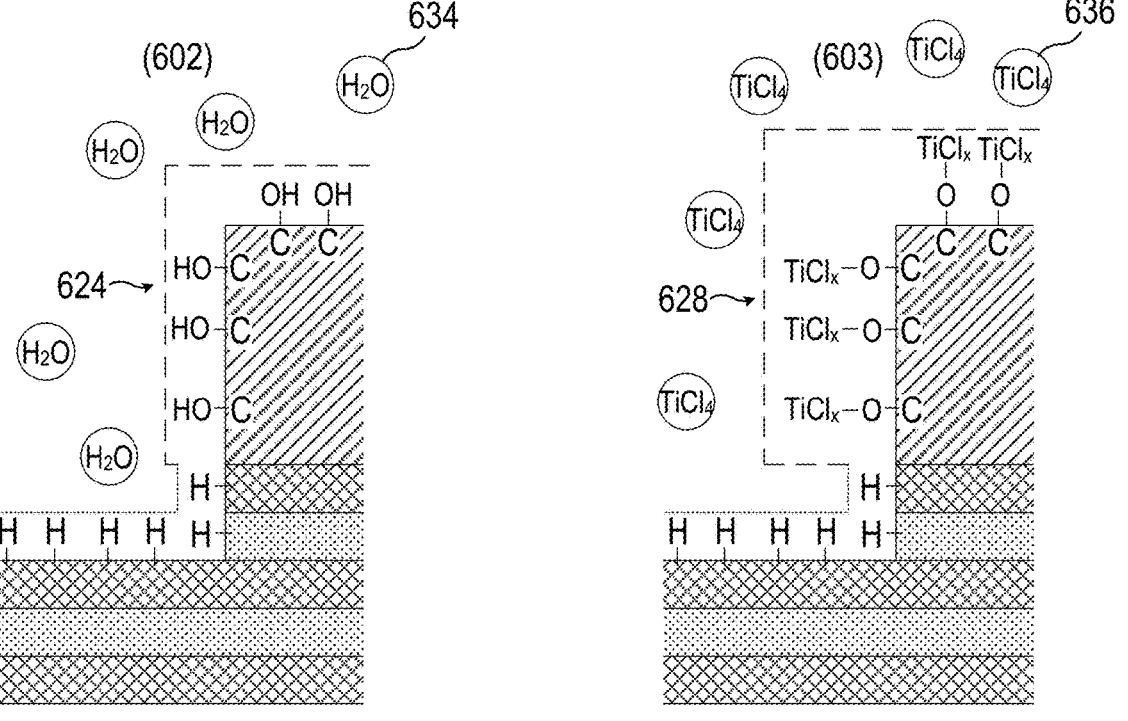

FIG. 6 illustrates another specific example of a deposition process schematically showing a remote plasma pretreatment and a non-plasma vapor treatment performed before a non-plasma halide treatment that are used to selectively deposit a mask protection material on a patterned mask in accordance with embodiments of the invention. The deposition process of FIG. 6 may be a specific implementation of other deposition processes described herein such as the deposition process of FIG. 4, for example. Similarly labeled elements may be as previously described.

Referring to FIG. 6, a deposition process 600 includes a remote plasma pretreatment 601, a non-plasma vapor treatment 602, and a non-plasma halide gas treatment 603 that result in the formation of a first layer of a mask protection material 628. During the remote plasma pretreatment 601, a substrate 610 that includes a carbon-based mask 620 on an underlying layer 612 (here, an ONON stack, but it may also be an OPOP stack, a bulk material, or another configuration) is pretreated with reactive chlorine 632 (chlorine from remote plasma, such as chlorine ions, chorine radicals). The reactive chlorine 632 reacts with hydrogen-terminated carbon 625 of the carbon-based mask 620 to form a chlorine-terminated surface 622 (a reactive surface), but does not react (or reacts little) with an unreactive underlying termination 623 of the underlying layer 612 (here, including hydrogen-terminated oxide 627 and hydrogen-terminated nitride 629).

The chlorine-terminated surface 622 and the unreactive underlying termination 623 are treated with water vapor 634 (a non-plasma vapor) during the non-plasma vapor treatment 602 to form a hydroxyl-functionalized surface 624. When the hydroxyl-functionalized surface 624 is treated with a titanium tetrachloride vapor 636 to form a mask protection material 628 is formed (e.g., a completed mask protection material, which here is titanium oxide, and that has a halide-terminated surface which can be reacted with a subsequent repeated non-plasma vapor treatment 602 to continue the deposition).

In the specific example of the deposition process 600 a remote Cl2 plasma chloridizes a carbon-based surface to enhance the C—OH first layer formation in H2O gas which in turn facilitates the selective deposition of the nitride on carbon. The C—Cl bond is favored for reacting with the water vapor 634 in this approach over C—F/C—H bonds. Further, the deposition process 600 may have the advantage that the remote Cl-plasma treatment may be self-limiting on an ONON or OPOP stack. To "regenerate" the mask protection material, the WF6 and O2 maybe provided during the etching process along with the etching gas (e.g., F—, C- and/or H-containing gases).

Figure 7:
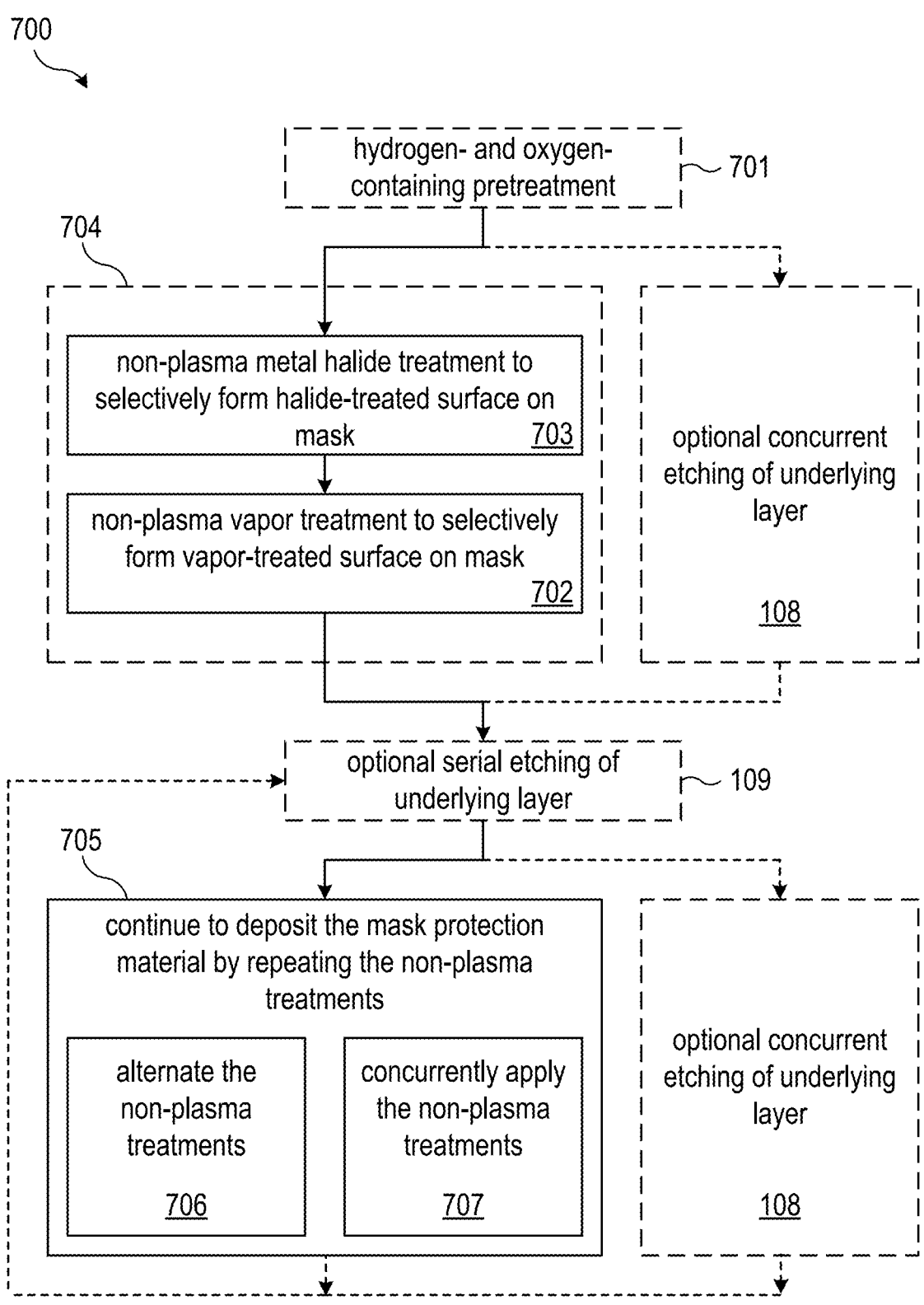
FIG. 7 illustrates an example method that includes performing a metal halide treatment before performing a vapor treatment on a patterned mask to selectively deposit a mask protection material where both treatments are non-plasma treatments in accordance with embodiments of the invention.

FIG. 7 illustrates an example method that includes performing a metal halide treatment before performing a vapor treatment on a patterned mask to selectively deposit a mask protection material where both treatments are non-plasma treatments in accordance with embodiments of the invention. The method of FIG. 7 may be combined with other methods and performed using the systems and apparatuses as described herein. For example, the method of FIG. may be combined with any of the embodiments of FIGS. 1-6 and 8-11. Although shown in a logical order, the arrangement and numbering of the steps of FIG. 7 are not intended to be limited. The method steps of FIG. 7 may be performed in any suitable order or concurrently with one another as may be apparent to a person of skill in the art. Similarly labeled elements may be as previously described.

Referring to FIG. 7, a method 700 may be used to selectively deposit a mask protection material on a mask. The method 700 may be a specific implementation of the method 100 where the first treatment of the process to form the first layer of the mask protection material (step 704) is a non-plasma metal halide treatment 703 which is then followed by a non-plasma vapor treatment 702. An optional pretreatment 701 may also be included in certain situations, such as if the surface chemistry of the mask and/or the underlying layer needs to be changed in preparation for the non-plasma metal halide treatment 703.

When included, the optional pretreatment 701 includes pretreating a mask (e.g., a carbon-based mask) having openings exposing an underlying layer with gas comprising at least one of water vapor, hydrogen peroxide (H2O2), or hydrogen (H2) and oxygen (O2) to selectively form a reactive surface on the mask. The non-plasma metal halide treatment 703 then includes treating the mask (e.g., the reactive surface) and the underlying layer with a non-plasma metal halide gas (e.g., tungsten fluoride gas, titanium chloride gas, etc.) to deposit a first component and form a halide-treated surface on the carbon-based mask. After the forming the halide-treated surface, the non-plasma vapor treatment 702 includes treating the halide-treated surface with a non-plasma nitrogen- or oxygen-containing vapor (e.g., ammonia vapor, water vapor, etc.) to deposit a second component and form a mask protection material on the carbon-based mask.

After the first layer of the mask protection material is deposited in step 704, the non-plasma treatments (i.e., the non-plasma metal halide treatment 703 and then the non-plasma vapor treatment 702) may be repeated to continue the deposition of the mask protection material (step 705). As before, this may be accomplished by alternating the non-plasma treatments (step 706) as part of a cycle, by concurrently applying the non-plasma treatments (step 707), or some combination thereof (such as by continually applying one of the treatments and pulsing the other treatment).

Figure 8:
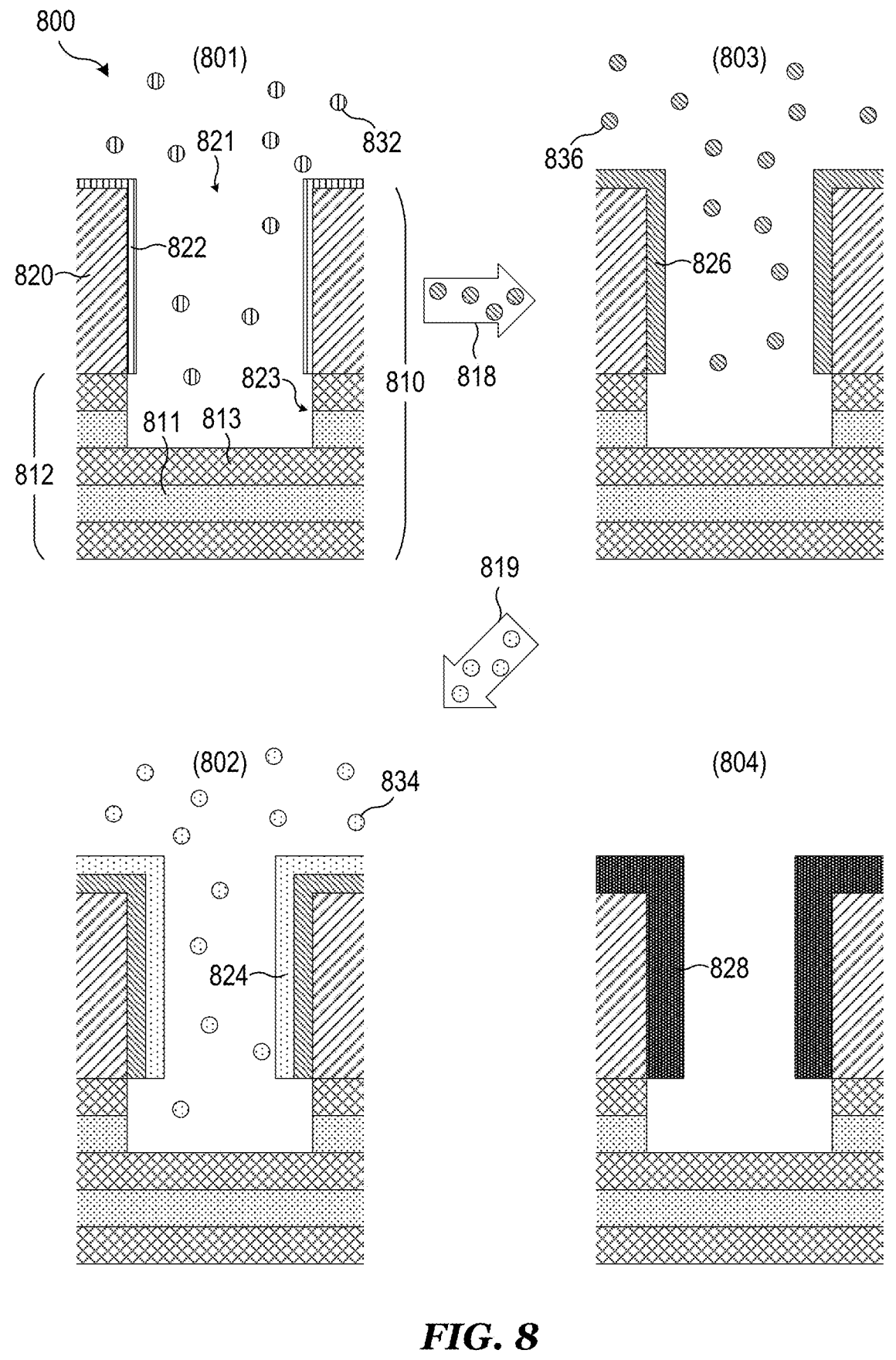

FIG. 8 illustrates an example deposition process schematically showing an optional pretreatment and a non-plasma metal halide treatment performed before a non-plasma vapor treatment that are used to selectively deposit a mask protection material on a patterned mask in accordance with embodiments of the invention. The deposition process of FIG. 8 may include specific implementations of methods described herein such as the method of FIG. 1, for example. Similarly labeled elements may be as previously described.

Referring to FIG. 8, a deposition process 800 includes an optional pretreatment 801, non-plasma halide gas treatment 803, and a non-plasma vapor treatment 802 that result in the formation of a first layer of a mask protection material 828 (step 804). The deposition process 800 is an example of a halide-first option (step 818) where a vapor reacts with a halide-treated surface (step 819). During the optional pretreatment 801, a substrate 810 that includes a mask 820 with openings 821 through which an underlying layer 812 is exposed is pretreated with a pretreatment gas 832 (such as water vapor, hydrogen peroxide (H₂O₂), or hydrogen (H₂) and oxygen (O₂)). The pretreatment gas 832 reacts with the mask 820 to form a reactive surface 822, but does not react (or reacts little) with an unreactive underlying termination 823 of the underlying layer 812, such as unreactive termination of oxide layers 811 and nitride layers 813 of an ONON stack, as shown (another example of a stack would be an OPOP stack of alternating oxide and polysilicon layers).

The reactive surface 822 and the unreactive underlying termination 823 are treated with a non-plasma metal halide gas 836 during the non-plasma halide gas treatment 803 to form a halide-treated surface 826. Since the optional pretreatment 801 formed the reactive surface 822 on the mask 820 and not the underlying layer 812, the non-plasma metal halide gas 836 has no significant reaction with the underlying layer 812 during the non-plasma halide gas treatment 803 and the halide-treated surface 826 is only formed on the mask 820. Similarly, when the halide-treated surface 826 is treated with a non-plasma vapor 834 to form a vapor-treated surface 824 during the non-plasma vapor treatment 802, the vapor-treated surface 824 is only formed on the mask 820 (i.e., selectively deposited on the mask 820 to form the mask protection material 828 as shown in step 804 as a single mask protection material). Of course, the non-plasma halide gas treatment 803 and the non-plasma vapor treatment 802 may be repeated (alternating, concurrently, etc.) to deposit more of the mask protection material 828 before and/or during an etching process.

Figure 9:
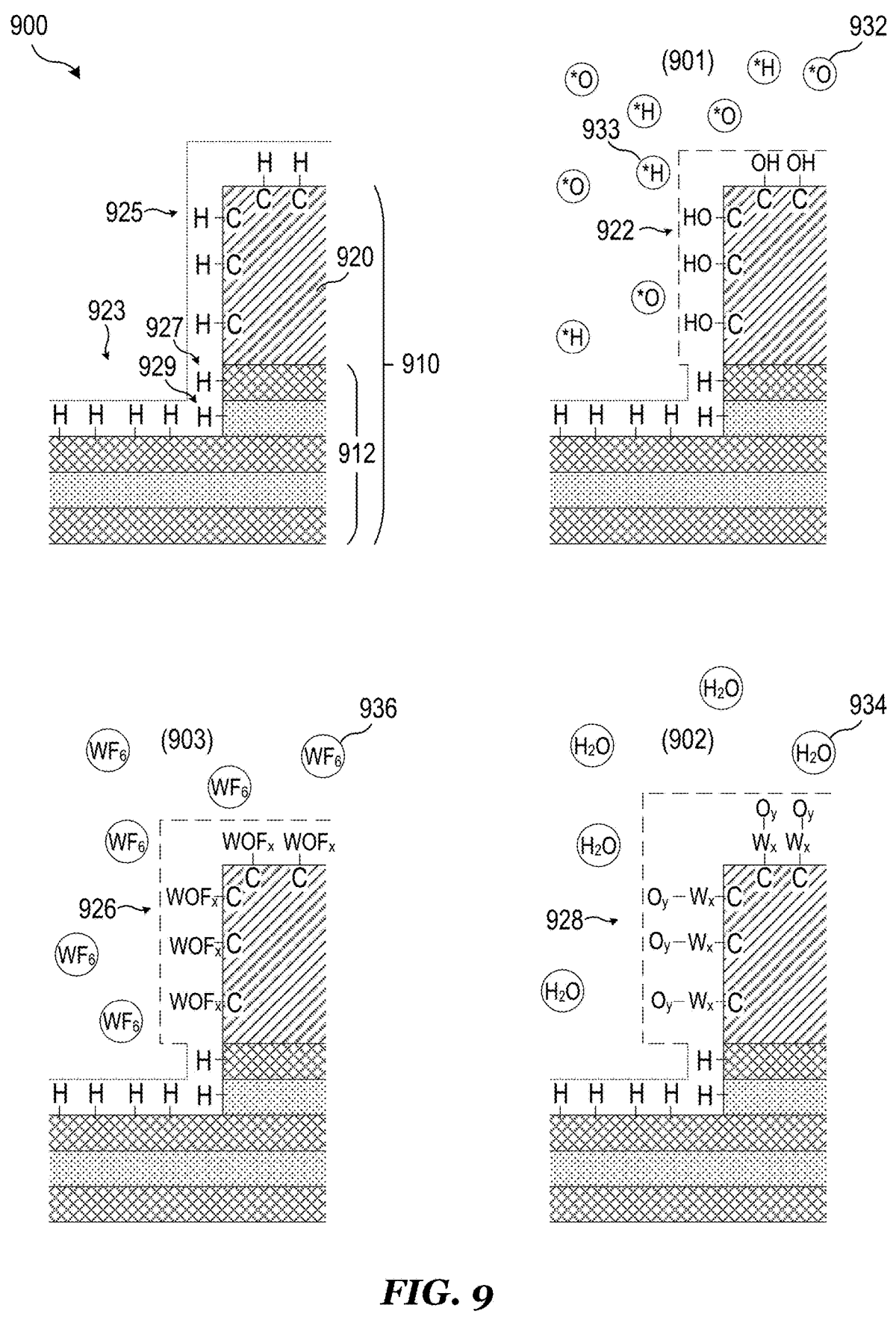

FIG. 9 illustrates a specific example of a deposition process schematically showing an optional pretreatment and a non-plasma metal halide treatment performed before a non-plasma vapor treatment that are used to selectively deposit a mask protection material on a patterned mask in accordance with embodiments of the invention. The deposition process of FIG. 9 may be a specific implementation of other deposition processes described herein such as the deposition process of FIG. 8, for example. Similarly labeled elements may be as previously described.

Referring to FIG. 9, a deposition process 900 includes a remote plasma pretreatment 901, a non-plasma tungsten fluoride treatment 903, and a non-plasma water vapor treatment 902 that result in the formation of a first layer of a mask protection material 928. During the remote plasma pretreatment 901, a substrate 910 including a carbon-based mask

920 on an underlying layer 912 is pretreated with reactive oxygen 932 and reactive hydrogen 933 (e.g., hydrogen and oxygen species generated from a remote plasma, such as ions and radicals). The reactive oxygen 932 and the reactive hydrogen 933 react with hydrogen-terminated carbon 925 of the carbon-based mask 920 to form a hydroxyl-terminated surface 922 (a reactive surface), but does not react (or reacts little) with an unreactive underlying termination 923 of the underlying layer 912 (here, including hydrogen-terminated oxide 927 and hydrogen-terminated nitride 929).

The hydroxyl-terminated surface 922 and the unreactive underlying termination 923 are treated with a non-plasma tungsten fluoride gas 936 (a non-plasma metal halide gas) during the non-plasma tungsten fluoride treatment 903 to form a tungsten-treated surface 926. When the tungsten-treated surface 926 is treated with a non-plasma water vapor 934 a mask protection material 928 is formed (e.g., a completed mask protection material, which here is tungsten oxide, and that has an oxygen-terminated surface which can be reacted with a subsequent repeated non-plasma tungsten fluoride treatment 903 to continue the deposition).

The remote plasma pretreatment 901 may be omitted in some situations, such as when the surface of the carbon-based mask 920 already carries a hydroxyl termination (from an earlier etch or other source). Otherwise, the remote plasma pretreatment 901 may be used to create the desired thermodynamically favorable C—OH surface chemistry. For example, the C—OH may bind favorably with metal-halides more strongly than the terminated surfaces of the underlying layer (e.g., Si—OH, Si—NH₂, etc.). In this specific example of the deposition process 900, selectivity may advantageously be achieved when C—OH substitutes the bond to form C—O—WF₅ more easily than Si—OH and Si—NH₂.

Figure 10:
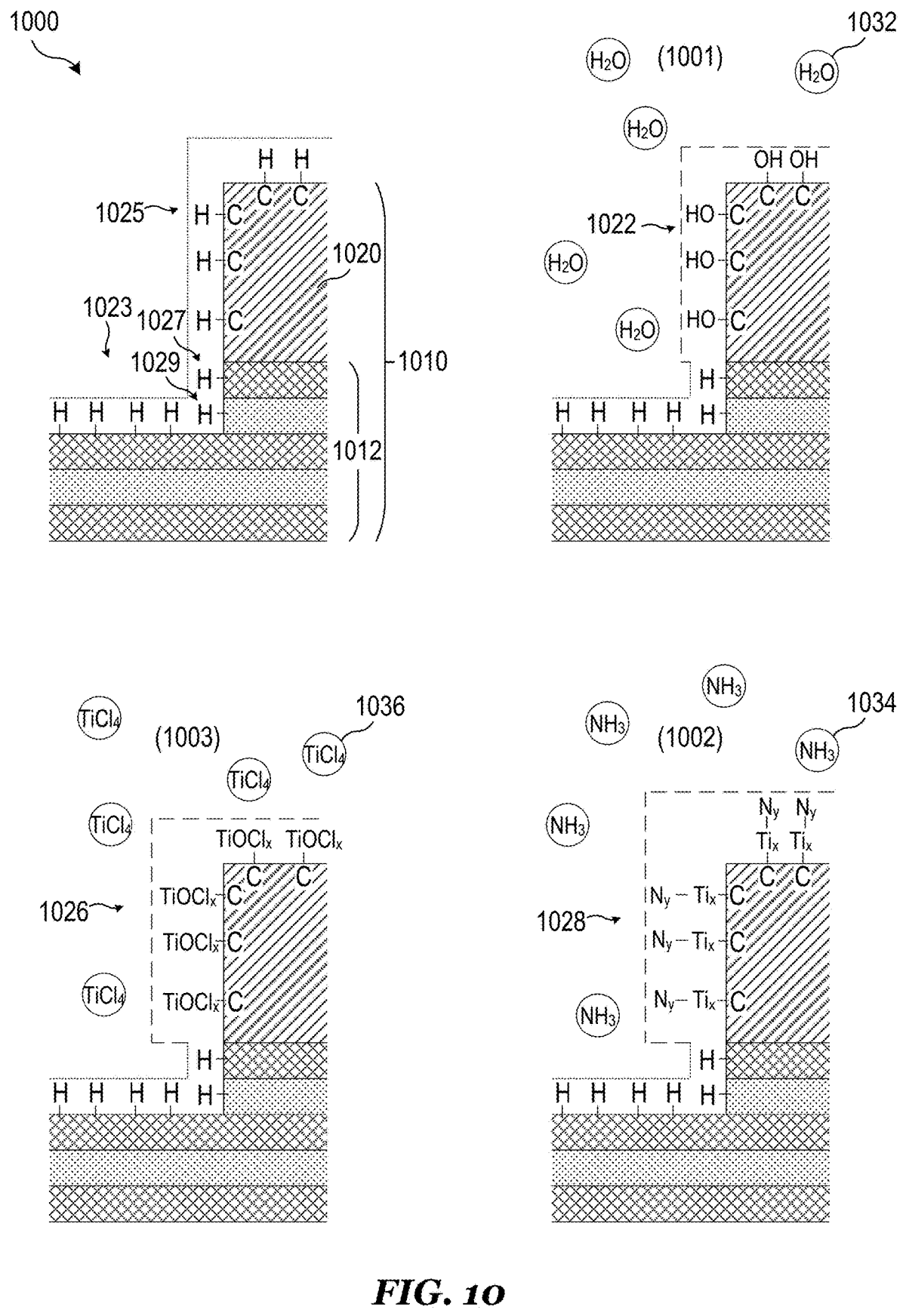

FIG. 10 illustrates another specific example of a deposition process schematically showing an optional pretreatment and a non-plasma metal halide treatment performed before a non-plasma vapor treatment that are used to selectively deposit a mask protection material on a patterned mask in accordance with embodiments of the invention. The deposition process of FIG. 10 may be a specific implementation of other deposition processes described herein such as the deposition process of FIG. 8, for example. Similarly labeled elements may be as previously described.

Referring to FIG. 10, a deposition process 1000 includes a water vapor pretreatment 1001, a non-plasma titanium chloride treatment 1003, and a non-plasma ammonia treatment 1002 that result in the formation of a first layer of a mask protection material 1028. During the water vapor pretreatment 1001, a substrate 1010 that includes a carbon-based mask 1020 on an underlying layer 1012 is pretreated with water vapor 1032. The water vapor 1032 reacts with hydrogen-terminated carbon 1025 of the carbon-based mask 1020 to form a hydroxyl-terminated surface 1022 (a reactive surface), but does not react (or reacts little) with an unreactive underlying termination 1023 of the underlying layer 1012 (here, including hydrogen-terminated oxide 1027 and hydrogen-terminated nitride 1029).

The hydroxyl-terminated surface 1022 and the unreactive underlying termination 1023 are treated with a non-plasma titanium chloride gas 1036 (a non-plasma metal halide gas) during the non-plasma titanium chloride treatment 1003 to form a titanium-treated surface 1026. When the titanium-treated surface 1026 is treated with a non-plasma ammonia vapor 1034 a mask protection material 1028 is formed (e.g., a completed mask protection material, which here is titanium nitride, and that has an nitride-terminated surface which can be reacted with a subsequent repeated non-plasma titanium chloride treatment 1003 to continue the deposition).

The water vapor pretreatment 1001 may be omitted in some situations, such as when the surface of the carbon-based mask 1020 already carries a hydroxyl termination (from an earlier etch or other source). Otherwise, the water vapor pretreatment 1001 may be used to create the desired thermodynamically favorable C—OH surface chemistry. For example, the C—OH may bind favorably with metal-halides more strongly than the terminated surfaces of the underlying layer (e.g., Si—OH, Si—NH$_2$, etc.). In this specific example of the deposition process 1000, selectivity may advantageously be achieved when C—OH substitutes the bond to form C—O—TiCl$_3$ more easily than Si—OH and Si—NH$_2$.

FIG. 11 illustrates an example deposition system that includes a deposition chamber within which deposition processes including a non-plasma vapor treatment and a non-plasma halide treatment used to selectively deposit a mask protection material on a patterned mask may be performed in accordance with embodiments of the invention. The deposition system of FIG. 11 may be used to perform any of the methods and processes described herein such as the method of FIG. 1, for example. Similarly labeled elements are as previously described.

Referring to FIG. 11, a deposition system 1100 (e.g., a plasma deposition system, an etching system (e.g., plasma), such as an RIE etching system) includes a deposition apparatus 1170 with a substrate support 1140 disposed within a deposition chamber 1171 and configured to support a substrate 1110. A non-plasma vapor source 1172 (e.g., a water vapor source, ammonia vapor source, etc.) and a non-plasma halide gas source 1174 (e.g., boron chloride, tungsten fluoride, etc.)) are fluidically coupled to the deposition chamber 1171 through a non-plasma vapor valve 1173 and a non-plasma halide gas valve 1175, respectively. Non-plasma vapor treatments and non-plasma halide treatments may be performed in situ in the deposition chamber 1171, using the non-plasma vapor source 1172 and the non-plasma halide gas source 1174 (and other sources), for example.

Additional gas sources and valves may also be included in the deposition system 1100. For example, an optional carrier gas source 1176 may be fluidically coupled to the deposition chamber 1171 through an optional carrier gas valve 1177 (an additional gas may be any type of gas, and multiple additional gases may be included) while an optional etch gas source 1178 may also be fluidically coupled to the deposition chamber 1171 through an optional etch gas valve 1179. Additionally, such as in the case of remote plasma pretreatments, an optional pretreatment source 1131 may be fluidically coupled to the deposition chamber 1171. The optional pretreatment source 1131 may generate an optional remote plasma 1132. Alternatively, the optional pretreatment source 1131 may be a gas source rather than a remote plasma source. An exhaust valve 1189 is included to evacuate the deposition chamber 1171 during the etching process.

The deposition system 1100 may be configured to generate an optional plasma 1142 during any or all of the steps of an etching process (e.g., during a plasma etching process, such as an RIE process). The deposition chamber 1171 may be any suitable etching chamber, such as CCP etching chamber, an ICP etching, chamber, etc. An optional temperature monitor 1186 may be included to monitor and/or aid in controlling the temperature of the substrate 1110 and the environment in the deposition chamber 1171. An optional heater 1187 may be included to elevated the temperate of the substrate 1110 above the equilibrium temperature at the substrate 1110 during the etching process. An optional motor 1188 may also be included to improve etching uniformity.

A controller 1180 is operationally coupled to the valves, and may be operationally coupled to any of the optional temperature monitor 1186, the optional heater 1187, the optional motor 1188, and the exhaust valve 1189. The controller 1180 includes a processor 1182 and a memory 1184 (i.e., a non-transitory computer-readable medium) that stores a program including instructions that, when executed by the processor 1182, perform an etching process. For example, the memory 1184 may have volatile memory (e.g., random access memory (RAM)) and non-volatile memory (e.g., flash memory). Alternatively, the program may be stored in physical memory at a remote location, such as in cloud storage. The processor 1182 may be any suitable processor, such as the processor of a microcontroller, a general-purpose processor (such as a central processing unit (CPU), a microprocessor, a field-programmable gate array (FPGA), an application-specific integrated circuit (ASIC), and others.

Example embodiments of the invention are summarized here. Other embodiments can also be understood from the entirety of the specification as well as the claims filed herein.

Example 1. A method including: performing a non-plasma vapor treatment including treating a mask having openings exposing an underlying layer with a non-plasma vapor to selectively deposit a first component of a mask protection material on the mask; and performing a non-plasma halide treatment including treating the mask and the underlying layer with a non-plasma halide gas to selectively deposit a second component of the mask protection material on the mask.

Example 2. The method of example 1, further including: performing a pretreatment including pretreating the mask and the underlying layer to selectively form a reactive surface on the mask before performing both the non-plasma vapor treatment and the non-plasma halide treatment.

Example 3. The method of example 2, where the pretreatment includes treating the mask and the underlying layer with chlorine from a remote plasma.

Example 4. The method of one of examples 2 and 3, where the pretreatment includes treating the mask and the underlying layer with a gas including hydrogen and oxygen.

Example 5. The method of one of examples 2 to 4, where the non-plasma vapor treatment includes treating the reactive surface with the non-plasma vapor to form a vapor-treated surface on the mask, the vapor-treated surface including the first component, and where the non-plasma halide treatment includes treating the vapor-treated surface with the non-plasma halide gas to form the mask protection material on the mask, the mask protection material including both the first component and the second component.

Example 6. The method of one of examples 2 to 4, where the non-plasma halide gas is a metal halide gas, where the non-plasma halide treatment includes treating the reactive surface with the metal halide gas to form a halide-treated surface on the mask, the halide-treated surface including the second component, and where the non-plasma vapor treatment includes treating the halide-treated surface with the non-plasma vapor to form the mask protection material on the mask, the mask protection material including both the first component and the second component.

Example 7. The method of one of examples 2 to 6, where the non-plasma vapor includes ammonia vapor or water vapor.

Example 8. The method of one of examples 1 to 7, where the non-plasma halide gas is a metal halide gas.

Example 9. The method of one of examples 1 to 8, further including: continuing to deposit the mask protection material by concurrently applying the non-plasma vapor treatment and the non-plasma halide treatment.

Example 10. The method of one of examples 1 to 8, further including: continuing to deposit the mask protection material by alternating the non-plasma vapor treatment and the non-plasma halide treatment as part of a cycle.

Example 11. A method including: performing a pretreatment including pretreating a carbon-based mask having openings exposing an underlying layer with a remote plasma species to selectively form a reactive surface on the carbon-based mask; performing a non-plasma vapor treatment including treating the reactive surface with a non-plasma nitrogen- or oxygen-containing vapor to deposit a first component and form a vapor-treated surface on the carbon-based mask; and performing a non-plasma halide treatment including treating the vapor-treated surface with a non-plasma halide gas to deposit a second component and form a mask protection material on the carbon-based mask, the mask protection material including both the first component and the second component.

Example 12. The method of example 11, where the remote plasma species includes chlorine.

Example 13. The method of one of examples 11 and 12, where the nitrogen- or oxygen-containing vapor is ammonia vapor or water vapor.

Example 14. The method of one of examples 11 to 13, where the non-plasma halide gas is boron chloride gas or titanium chloride gas.

Example 15. The method of one of examples 11 to 14, where the underlying layer is an ONON stack including alternating oxide layers and nitride layers or is an OPOP stack including alternating oxide layers and polysilicon layers.

Example 16. A method including: performing a non-plasma metal halide treatment including treating a carbon-based mask having openings exposing an underlying layer with a non-plasma metal halide gas to deposit a first component and form a halide-treated surface on the carbon-based mask; and performing a non-plasma vapor treatment including treating the halide-treated surface with a non-plasma nitrogen- or oxygen-containing vapor to deposit a second component and form a mask protection material on the carbon-based mask, the mask protection material including both the first component and the second component.

Example 17. The method of example 16, further including: performing a pretreatment including pretreating the carbon-based mask and the underlying layer with gas including at least one of water vapor, hydrogen peroxide ($H_2O_2$), or hydrogen ($H_2$) and oxygen ($O_2$) to selectively form a reactive surface on the carbon-based mask before performing both the non-plasma vapor treatment and the non-plasma halide treatment.

Example 18. The method of one of examples 16 and 17, where the non-plasma metal halide gas is tungsten fluoride gas or titanium chloride gas.

Example 19. The method of one of examples 16 to 18, where the nitrogen- or oxygen-containing vapor is ammonia vapor or water vapor.

Example 20. The method of one of examples 16 to 19, where the underlying layer is an ONON stack including alternating oxide layers and nitride layers or is an OPOP stack including alternating oxide layers and polysilicon layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
performing a non-plasma vapor treatment comprising treating a mask having openings exposing an underlying layer with a non-plasma vapor to selectively deposit a first component of a mask protection material on the mask; and
performing a non-plasma halide treatment comprising treating the mask and the underlying layer with a non-plasma halide gas to selectively deposit a second component of the mask protection material on the mask.

2. The method of claim 1, further comprising:
performing a pretreatment comprising pretreating the mask and the underlying layer to selectively form a reactive surface on the mask before performing both the non-plasma vapor treatment and the non-plasma halide treatment.

3. The method of claim 2, wherein the pretreatment comprises treating the mask and the underlying layer with chlorine from a remote plasma.

4. The method of claim 2, wherein the pretreatment comprises treating the mask and the underlying layer with a gas comprising hydrogen and oxygen.

5. The method of claim 2,
wherein the non-plasma vapor treatment comprises treating the reactive surface with the non-plasma vapor to form a vapor-treated surface on the mask, the vapor-treated surface comprising the first component, and
wherein the non-plasma halide treatment comprises treating the vapor-treated surface with the non-plasma halide gas to form the mask protection material on the mask, the mask protection material comprising both the first component and the second component.

6. The method of claim 2,
wherein the non-plasma halide gas is a metal halide gas,
wherein the non-plasma halide treatment comprises treating the reactive surface with the metal halide gas to form a halide-treated surface on the mask, the halide-treated surface comprising the second component, and
wherein the non-plasma vapor treatment comprises treating the halide-treated surface with the non-plasma vapor to form the mask protection material on the mask, the mask protection material comprising both the first component and the second component.

7. The method of claim 2, wherein the non-plasma vapor comprises ammonia vapor or water vapor.

8. The method of claim 1, wherein the non-plasma halide gas is a metal halide gas.

9. The method of claim 1, further comprising:
continuing to deposit the mask protection material by concurrently applying the non-plasma vapor treatment and the non-plasma halide treatment.

10. The method of claim 1, further comprising:
continuing to deposit the mask protection material by alternating the non-plasma vapor treatment and the non-plasma halide treatment as part of a cycle.

11. The method of claim 1, wherein both the non-plasma vapor treatment and the non-plasma halide treatment are performed in situ in a single deposition chamber.

12. A method comprising:

performing a pretreatment comprising pretreating a carbon-based mask having openings exposing an underlying layer with a remote plasma species to selectively form a reactive surface on the carbon-based mask;

performing a non-plasma vapor treatment comprising treating the reactive surface with a non-plasma nitrogen- or oxygen-containing vapor to deposit a first component and form a vapor-treated surface on the carbon-based mask; and performing a non-plasma halide treatment comprising treating the vapor-treated surface with a non-plasma halide gas to deposit a second component and form a mask protection material on the carbon-based mask, the mask protection material comprising both the first component and the second component.

13. The method of claim 12, wherein the remote plasma species comprises chlorine.

14. The method of claim 12, wherein the nitrogen- or oxygen-containing vapor is ammonia vapor or water vapor.

15. The method of claim 12, wherein the non-plasma halide gas is boron chloride gas or titanium chloride gas.

16. The method of claim 12, wherein the underlying layer is an ONON stack comprising alternating oxide layers and nitride layers or is an OPOP stack comprising alternating oxide layers and polysilicon layers.

17. A method comprising:

performing a non-plasma metal halide treatment comprising treating a carbon-based mask having openings exposing an underlying layer with a non-plasma metal halide gas to deposit a first component and form a halide-treated surface on the carbon-based mask; and performing a non-plasma vapor treatment comprising treating the halide-treated surface with a non-plasma nitrogen- or oxygen-containing vapor to deposit a second component and form a mask protection material on the carbon-based mask, the mask protection material comprising both the first component and the second component.

18. The method of claim 17, further comprising:

performing a pretreatment comprising pretreating the carbon-based mask and the underlying layer with gas comprising at least one of water vapor, hydrogen peroxide ($H_2O_2$), or hydrogen ($H_2$) and oxygen ($O_2$) to selectively form a reactive surface on the carbon-based mask before performing both the non-plasma vapor treatment and the non-plasma halide treatment.

19. The method of claim 17, wherein the non-plasma metal halide gas is tungsten fluoride gas or titanium chloride gas.

20. The method of claim 17, wherein the nitrogen- or oxygen-containing vapor is ammonia vapor or water vapor.

21. The method of claim 17, wherein the underlying layer is an ONON stack comprising alternating oxide layers and nitride layers or is an OPOP stack comprising alternating oxide layers and polysilicon layers.

\* \* \* \* \*